United States Patent [19]

Ohshima

[11] 4,265,128
[45] May 5, 1981

[54] TURRET TYPE FREQUENCY SELECTOR
[75] Inventor: Hideki Ohshima, Tokyo, Japan
[73] Assignee: Nihon Technical Kabushiki Kaisha, Tokyo, Japan
[21] Appl. No.: 37,291
[22] Filed: May 9, 1979
[30] Foreign Application Priority Data May 19, 1978 [JP] Japan ................................ 53-59654

[51] Int. Cl.³ ......................... H03J 5/02; H03J 5/06; F16H 27/02
[52] U.S. Cl. ................................. 74/10.15; 74/10.54; 74/10.85; 74/88; 74/128; 334/77
[58] Field of Search ................. 74/10.15, 10.54, 10.85, 74/88, 128; 334/74, 77

[56] References Cited
U.S. PATENT DOCUMENTS

| 2,780,372 | 2/1957 | Covitt et al. | 74/88 X |
| 3,769,620 | 10/1973 | Kimura et al. | 74/10.15 X |
| 4,043,207 | 8/1977 | Clarisse | 74/10.15 |

Primary Examiner—Allan D. Herrmann
Attorney, Agent, or Firm—Shapiro and Shapiro

[57] ABSTRACT

A frequency selector (tuner) employs a turret to select the position of a slide member that is coupled to a variable reactance. The slide member is moved away from the turret by depressing an operating member and returns to the turret when the operating member is released. Depressing the operating member rotates the turret concurrently with the movement of the slide member, but interference between the slide member and cooperating position setting elements that project from the turret is avoided by a displacement mechanism on the slide member. The projection of the position setting elements is adjusted by turning the operating member. A further operating member is provided for turning the turret in opposite directions, the final position of the slide member being set by depressing the first-mentioned operating member.

22 Claims, 10 Drawing Figures

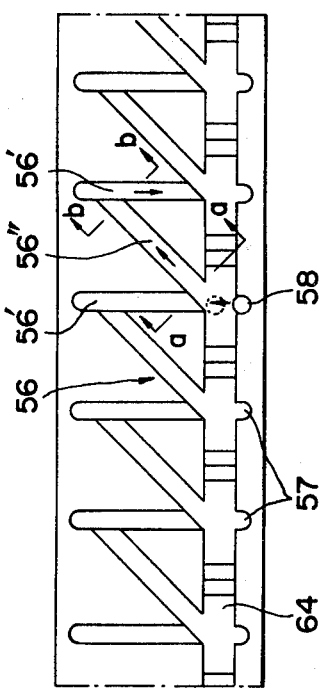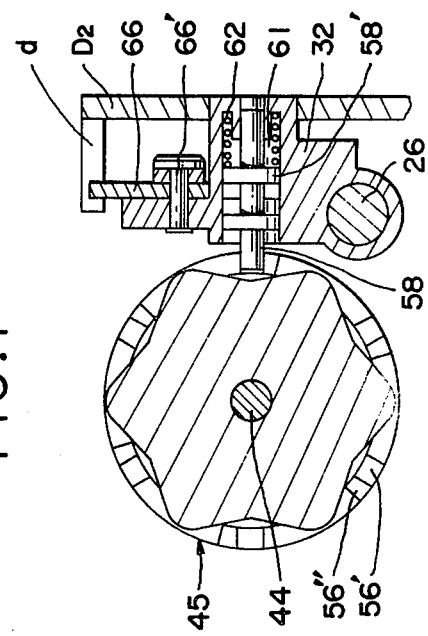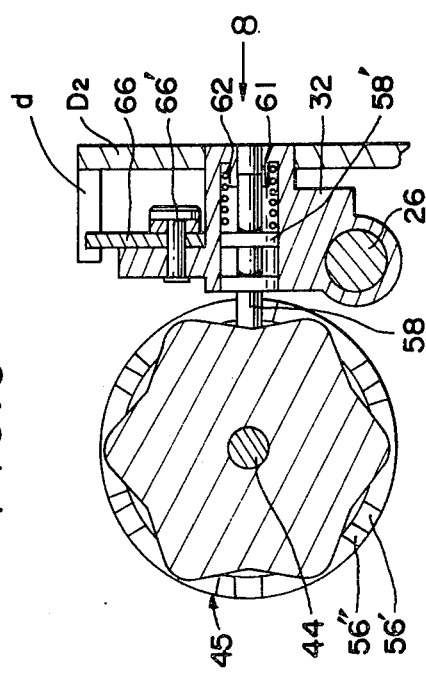

TURRET TYPE FREQUENCY SELECTOR

BACKGROUND OF THE INVENTION

This invention relates to apparatus in which a slide member is selectively positioned by a turret, and is more particularly concerned with a frequency selector or tuner in which a variable reactance coupled to a slide member is adjusted by step-wise rotation of a turret.

In the frequency selector disclosed in U.S. Pat. No. 4,043,207, a slide member is moved to its maximum displacement, against the force of a spring, when an operating member is initially depressed, and then a turret is caused to rotate by further depressing the operating member. This mode of operation is required to prevent collision between the slide member and cooperating position setting elements on the turret, which would otherwise obstruct rotation of the turret and cause damage to the position setting elements and/or the slide member. Since the operating member must have a long stroke in order to provide, first, the maximum displacement of the slide member, and second, rotation of the turret, the size of the frequency selector must be great enough to accommodate the stroke, and the radio or other apparatus incorporating the frequency selector must be dimensioned accordingly. The operating knob provided at the end of the operating member projects greatly from the apparatus, which is undesirable from a design or safety standpoint, particularly when the apparatus is installed in a vehicle.

The frequency selector disclosed in the aforesaid patent has another disadvantage. In the construction disclosed, the slide member is resiliently brought into contact with position setting elements through a transmission rod provided on the slide member and urged toward the selected setting element by a strong spring, which resists a force applied to the slide member. Therefore, to rotate the turret, the operating knob must be depressed against a strong spring force, which is inconvenient.

SUMMARY OF THE INVENTION

Accordingly, it is a principal object of the invention to provide improved apparatus employing a turret for selectively setting the position of a slide member, more particularly an improved frequency selector of the turret type.

Another object of the invention is to provide apparatus of the foregoing type in which the stroke of an operating member and the force required for depressing the operating member are relatively small.

A further object of the invention is to provide apparatus of the foregoing type in which depression of the operating member produces step-wise rotation of the turret in one direction concurrently with movement of a slide member away from the turret, and in which obstruction between the slide member and the turret is prevented.

Another object of the invention is to provide apparatus of the foregoing type in which the turret can be rotated in opposite directions to a desired position by turning another operating member.

A further object of the invention is to provide apparatus of the last-mentioned type in which, after turning of the second operating member, the final position of the slide member is set by depressing the first-mentioned operating member.

Yet another object of the invention is to provide apparatus of the foregoing type in which the selected position of the slide member is determined by adjustable position setting elements projecting from the turret, the projection of which may be adjusted by turning the first-mentioned operating member.

Briefly stated, in one of its broader aspects apparatus for selecting the position of a slide member in accordance with the invention comprises a turret supported for rotation about an axis and having a plurality of circumferentially spaced position setting elements which project from an end of the turret toward the slide member, the slide member being supported for sliding movement toward and away from the position setting elements and being biased toward the position setting elements, the slide member having contact means adapted to engage a projecting end portion of a selected position setting element when that element is placed at a predetermined location by rotation of the turret, operating means for rotating the turret and concurrently moving the slide member away from the position setting elements, and displacement means for movably supporting the contact means on the slide member to permit the contact means to move out of the way when struck by a position setting element as the turret is rotated and later to move into engagement with the end portion of the selected position setting element.

The foregoing and object objects, features and advantages of the invention will become apparent to those skilled in the art from the following detailed description of a preferred embodiment of the invention taken in conjunction with the accompanying drawings.

BRIEF DESCRIPTION OF THE DRAWINGS

FIG. 5 is a plan view of a cam formed on the periphery of the turret, the cam being shown flat rather than in its actual cylindrical configuration;

FIG. 5a is a partial sectional view taken along line a—a of FIG. 5;

FIG. 5b is a partial sectional view taken along line b—b of FIG. 5;

FIG. 6 is a simplified transverse sectional view taken along line VI—VI of FIG. 1;

FIG. 7 is a simplified transverse sectional view similar to FIG. 6, but with the apparatus shown in a different position;

DESCRIPTION OF THE PREFERRED EMBODIMENT

Figure 1:
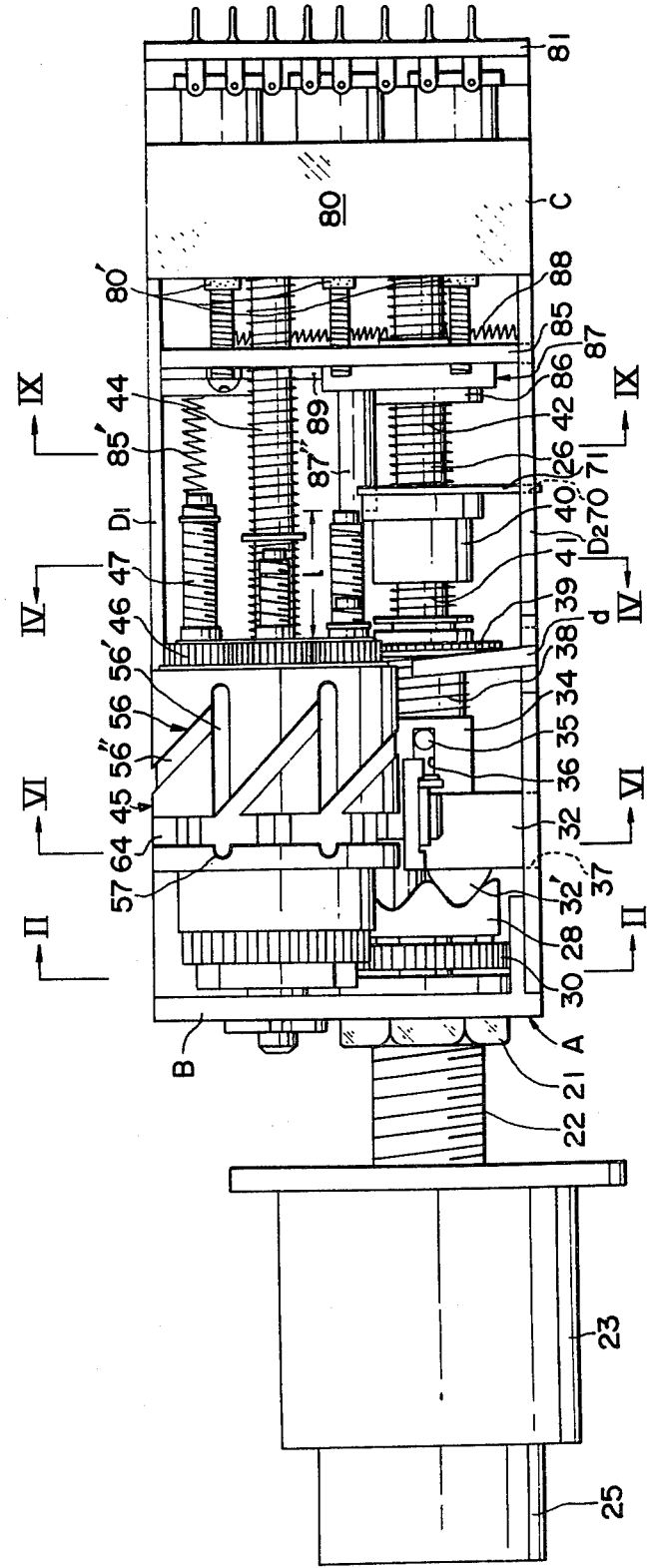
FIG. 1 is a plan view of frequency selector apparatus in accordance with the invention.

Referring to the drawings, and initially to FIG. 1, reference character A denotes a frame comprising front and rear support blocks B and C and side plates D1 and D2 interconnecting the support blocks. Front support block B is fitted, by means of a nut 21, with a bearing 22 in which is rotatably supported a first hollow operating rod 24 (see FIG. 3), to one end of which a first operating knob 23 is secured. Slidably and rotatably supported in hollow rod 24 is a second operating rod 26, to one end of which a second operating knob 25 is secured. The other end of rod 26 is slidably and rotatably supported in rear support block C. A cam 28, having, in the present embodiment, six raised portions and six depressed portions alternately formed on the circumference thereof, is secured to the other end of the first operating rod 24. A gear wheel 30 having a slot 29 (see FIG. 2) which receives a projection 28' of the cam 28 is rotatably mounted on the outer periphery of an elongated portion 22' of the bearing 22 (see FIG. 3). A movable piece 32 and a sleeve 34 are provided on the intermediate portion of the second operating rod 26 in such a manner that the movable piece 32 can be axially moved with rod 26 (rotatable in piece 32) and the sleeve 34 can be slid along and rotated with the rod 26 by means of a pin 35 and a slit 36. A part of the movable piece 32 is slidably received in a slot 37 formed in the side plate D2 of the frame A, so that the movable piece 32 cannot rotate with respect to frame A but can be slid with operating rod 26 along the axis of the operating rod. Sleeve 34 is provided with a gear wheel 39 urged in one direction by a spring 38, which is in frictional contact with gear wheel 39. Sleeve 34 as a whole is urged in one direction by a compression spring 41 interposed between the sleeve and a collar 40 secured to rod 26. Operating rod 26 as a whole is urged in one direction by a compressed resetting spring 42 interposed between the rear support block C and the collar 40. The operating rod is normally reset to the position illustrated in FIG. 3.

A rotating shaft 44 is supported on front and rear support blocks B and C parallel to operating rods 24 and 26 and has a cylindrical turret 45 secured thereto. A plurality of gear wheels 46 of small diameter (six gear wheels in the illustrated embodiment) are adapted to enage gear wheel 39 selectively and are rotatably supported on one end of turret 45 at positions equally spaced about the circumference of the turret. The number of gear wheels 46 corresponds to the number of frequencies to be selected.

An abutment screw 47, which functions as a position setting element for a slide member to be described, is screwed into the central bore of each gear wheel 46 and is moved axially when the associated gear wheel is rotated by gear wheel 39. A guide piece 48 is secured to the rear end of each abutment screw 47 and is guided along a guide groove 49 in a cylindrical well of turret 45 as the abutment screw moves in an axial direction.

Figure 2:
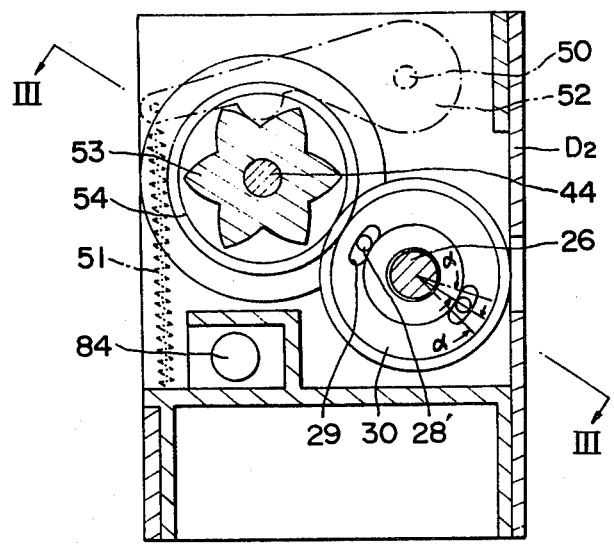
FIG. 2 is a simplified transverse sectional view taken along line II—II of FIG. 1.
Figure 3:
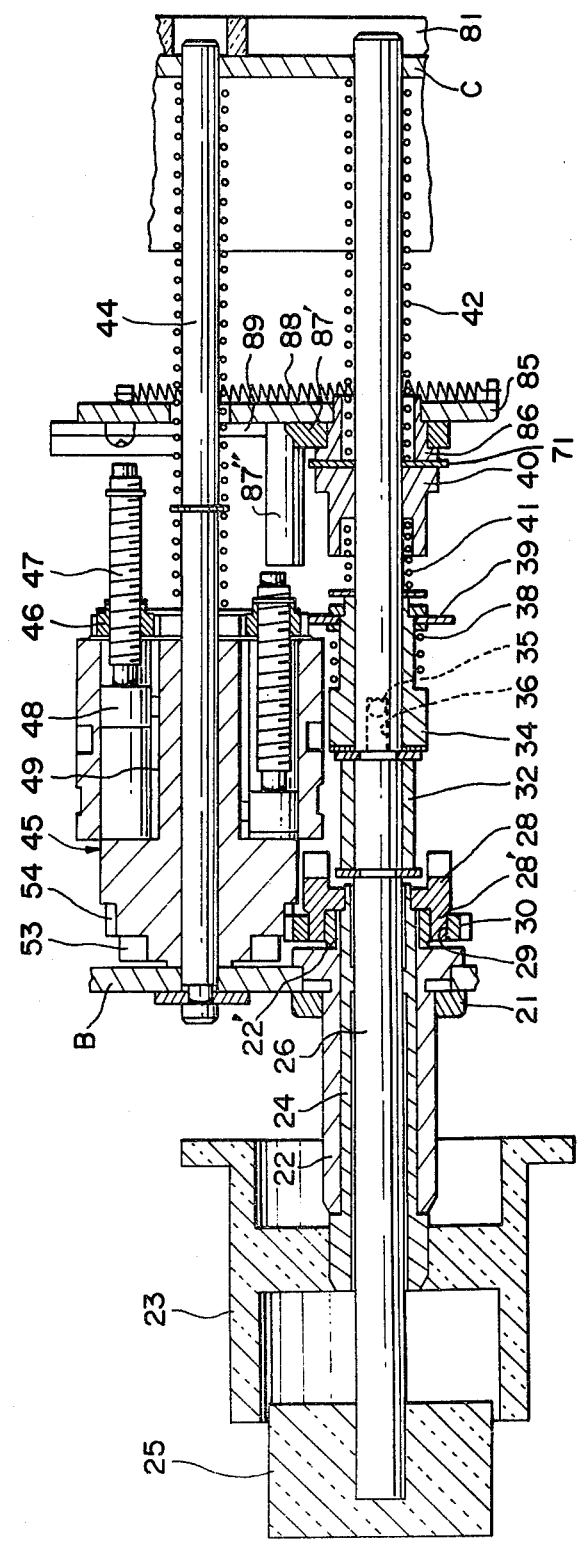
FIG. 3 is a simplified longitudinal sectional view taken along line III—III of FIG. 2, with the apparatus being shown in a different position from that of FIG. 1.

As shown in FIG. 2, a cam 53 is integrally formed with turret 45 at the front end thereof and cooperates with an intermediate portion of an oscillating lever 52 (shown in phantom in FIG. 2) so as to impart a stepwise rotation to the turret. The oscillating lever is rotatably supported at an end 50 by the front support block B of frame A, the other end of the lever being drawn toward cam 53 by a tension spring 51. As shown in FIG. 3, the front end of the turret is also provided with a gear wheel 54 in mesh with gear wheel 30 supported on the periphery of bearing 22.

As illustrated in FIG. 5, a series of zig-zag cam grooves 56 is provided in the outer peripheral surface of turret 45 and receives a spindle 58 projecting from the movable piece 32 (see FIGS. 6 and 7). The cooperative action of spindle 58 with the cam grooves 56 converts linear motion of the operating rod 26 to rotary motion of the turret in one direction. As seen in FIGS. 5a and 5b, steps 59 and 60 are formed at the borders between axial groove portions 56' and inclined groove portions 56''. Steps 59 and 60 formed in the cam grooves 56 are necessary to ensure that, when movable piece 32 is displaced as the operating rod 26 is slid axially, spindle 58 moves along the grooves 56 in the direction indicated by the arrows in FIG. 5 so that the turret 45 is rotated through the desired angles.

Also provided on the periphery of the turret 45, as shown in FIG. 5, is a circumferential groove 64 that transversely crosses the front end of cam grooves 56 and that has six raised and depressed portions alternately positioned about the circumference of the turret. Spindle 58 is slidably disposed in space 61 formed within the movable piece 32 and is urged toward rotating shaft 44 of the turret by a spring 62 as shown in FIG. 6. When the spindle rests on a raised portion of the circumferential groove 64, it is forced back into space 61 against the force of spring 62.

Figure 8:
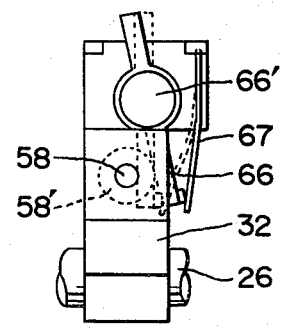
FIG. 8 is a simplified fragmentary side elevation view of the apparatus as viewed in the direction of arrow 8 of FIG. 6.

Movable piece 32 is fitted with a claw lever 66 (see FIGS. 6, 7 and 8) which is pivotally supported at its intermediate portion 66' and one end of which is urged toward the space 61 by a leaf spring 67. Thus, when the spindle 58 slides onto a raised portion of groove 64, a flange 58' of the spindle moves backwardly into space 61 beyond an adjacent end of claw lever 66, with the result that the spindle cannot return to its former position, even when aligned with a depressed portion of groove 64, because flange 58' is arrested by claw lever 66, as shown in dotted lines in FIG. 8.

Figure 4:
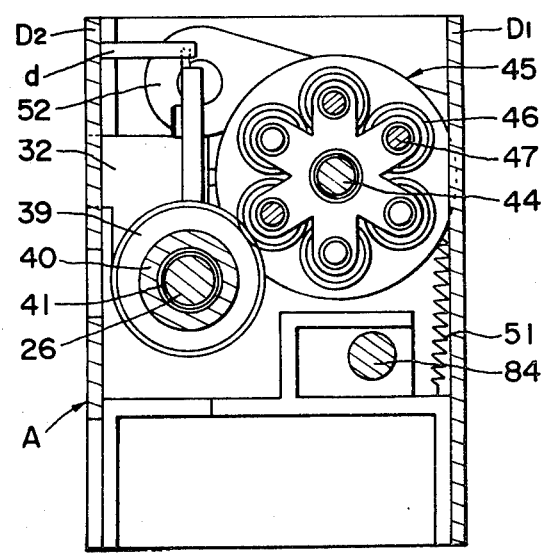
FIG. 4 is a transverse sectional view taken along line IV—IV of FIG. 1.

When the spindle 58 is withdrawn into space 61 as just described, it cannot engage step 59 formed between portions 56' and 56'' of cam grooves 56, and turret 45 cannot be rotated by the spindle even when an attempt is made to move the spindle in the direction of the arrows in FIG. 5 by sliding of operating rod 26 along its axis. However, if the operating rod is depressed sufficiently to move piece 32 so that the free end of claw lever 66 (FIG. 8) engages an arm d formed on the side plate D2 of frame A (see FIGS. 1 and 4), the claw lever 66 is pivoted against the force of leaf spring 67 and spindle 58 is released from restriction.

Movable piece 32 is also provided with a cam follower 32' (FIG. 1) that cooperates with cam 28 secured to the first operating rod 24. Before the rotation of the first operating rod is transmitted to gear 30, cam 28 turns through the angle α as shown in FIG. 2. This causes cam follower 32' to rest on a raised portion of cam 28, whereby the operating rod 26 is slid axially against the force of spring 42, bringing gear wheel 39 out of mesh with the gear wheel 46 with which it is engaged as shown in FIGS. 1 and 3.

For a purpose that will be described later, spindle 58 is normally received in one of a plurality of notches 57 formed at one side of circumferential groove 64 as shown in FIG. 5. Each notch 57 is an extension of a portion 56' of the cam grooves. A member 71 is interposed between the collar 40 and the resetting spring 42 and is slidably received in a slot 70 formed in the side plate D2 (FIG. 1) so that it cannot rotate. Member 71 is employed to prevent the distortion of the resetting spring 42 from being transmitted to the operating rod 26.

A variable reactance 80 is accommodated in a space (not shown) formed in the rear support block C of frame A and is fixed to the block through a base plate 81 by fastening means (not shown). The variable reactance may comprise an inductance element or a plurality of inductance elements having magnetic cores 80' (see FIG. 1) mounted on a slide member or plate 85 which is slidably guided along slots 83 (see FIG. 9) formed in side plate D2 of the frame and which is also guided by a guide spindle 84 supported in guide holes (not shown) formed in the support blocks B and C. The slide member is urged by a spring 85' (FIG. 1) toward the end of the turret from which the position setting elements 47 project.

Figure 9:
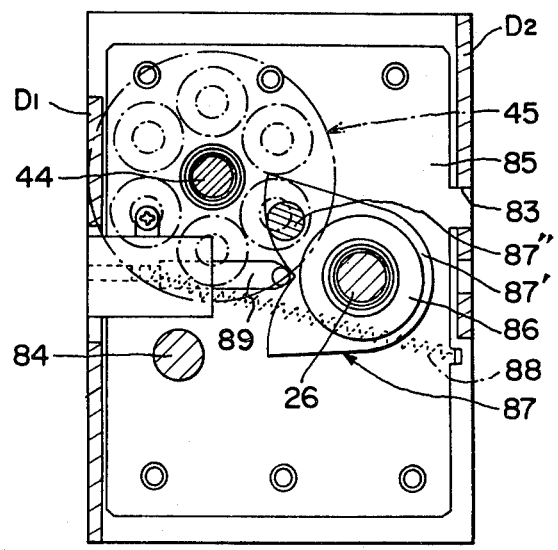
FIG. 9 is a transverse sectional view taken along IX—IX of FIG. 1.

Secured to slide member 85 is a hollow shaft 86 through which the second operating rod 26 passes. A displacement member 87 (see FIGS. 1 and 9) is pivotally supported on shaft 86. As shown, the displacement member comprises a heart-shaped body 87' and a shaft bar 87" projecting from body 87' toward the turret. As will be seen hereinafter, shaft bar 87" constitutes contact means for engaging an end portion of a position setting element 47 that has been positioned for cooperation with the contact means by rotation of the turret. As indicated in FIG. 9, body 87' is normally maintained in a rest position by a follower member 89 slidably guided along slide member 85 and urged by a spring 88 so as to rest resiliently on a concave portion of the heart-shaped body 87'. In the normal position illustrated in FIG. 9, slide member 85 is brought into contact with a selected abutment screw 47 via shaft bar 87" of the displacement member 87. The length of the shaft bar is chosen so that when the shaft bar is in resilient contact with an abutment screw 47 of minimum projection from the turret, the slide member 85 remains separated from the abutment screw 47 of maximum projection from the turret.

When knob 25 (FIG. 1) is turned, one of the gear wheels 46 which is in mesh with gear wheel 39 secured to the second operating shaft 26 is rotated, moving the associated abutment screw 47 axially and varying the length l of the projected portion of the abutment screw. Since the slide member 85 is resiliently brought into contact with the free end of a selected abutment screw through the shaft bar 87" projecting from the displacement member 87, the slide member moves toward or away from the turret in accordance with the projected length of the engaged abutment screw, so that the variable inductance 80 may be adjusted to select the desired frequency of a radio receiver, for example.

When an abutment screw is adjusted so as to project to the minimum or maximum possible extent, further rotation of knob 25 does not cause rotation of gear wheel 39, the gear wheel frictionally engaging spring 38 (FIG. 3) and slipping relative to sleeve 34 when the gear 46 in mesh with gear wheel 39 can turn no further. Moreover, rotation of gear wheel 39 cannot turn the turret, because spindle 58 is received in a notch 57 as shown in FIG. 5.

If knob 25 is depressed (to the right in FIGS. 1 and 3), operating rod 26 is caused to slide against the force of the resetting spring 42, whereby the gear wheels 39 and 46 are brought out of engagement from each other in the initial portion of the depression stroke. Spindle 58 projecting from movable piece 32 (which slides with rod 26) slides along an inclined portion 56" of the cam grooves 56 formed on the outer periphery of turret 45, applying a force to turret 45 which causes it to rotate. At the same time, member 71 (FIG. 1) is moved with operating shaft 26 so that it presses against a part of slide member 85 (an end surface of the hollow shaft 86 in the illustrated embodiment) causing the slide member to move (to the right in FIGS. 1 and 3) against the force of spring 85'. The stroke over which the slide member 85 is pushed away from the turret varies according to the initial position of the slide member, which depends upon the projected length of the abutment screw 47 with which the slide member is in resilient contact via shaft bar 87". Therefore, since rotation of the turret 45 and the backward movement of the slide plate 85 are both effected at the same time (that is, the slide member is not moved entirely away from the turret before the turret begins to rotate) it is possible that the next abutment screw 47 to be engaged with shaft bar 87' end-wise may project from the turret sufficiently to strike the side of bar 87" before the slide member can move sufficiently to prevent this collision. However, by virtue of the invention, such a collision is inconsequential, because bar 87" is part of the displacement member 87 and when an abutment screw strikes the side of bar 87", the displacement member may turn about shaft 86 (see FIG. 9), moving bar 87" out of the way of the abutment screw and permitting the turret to rotate. Because of this construction, the turret can rotate as the slide member 85 is being moved away from the turret, minimizing the required stroke of the operating rod 26.

At the final portion of the depression stroke of the operating rod 26, slide member 85 is pushed back far enough to clear the abutment screw of maximum projection from the turret, and the depression movement of the operating shaft 26 is stopped. At this time bar 87" cannot be engaged with an abutment screw 47, so that displacement member 87 is free to return to its normal position under the pressure of spring-biased follower member 89 (see FIG. 9).

When knob 25 is released, operating shaft 26 returns, by the action of resetting spring 42, to the position shown in FIGS. 1 and 3. At the same time, spindle 58 of movable piece 32 moves along an axial portion 56' of the cam grooves 56 in the direction indicated by the arrow in FIG. 5. This movement of the spindle is ensured by the step 60 formed between portions 56' and 56" of the cam grooves. Slide member 85 is now free to slide toward the turret under the force of spring 85', and the end of bar 87" is resiliently brought into contact with the free end of an abutment screw 47 selected, by rotation of turret 45, for cooperation with bar 87". Also, gear wheel 39 on operating rod 26 comes into mesh with gear wheel 46 of the selected abutment screw, as shown in FIGS. 1 and 3.

If the frequency selected by the abutment screw engaged with bar 87" is not the one desired, another frequency can be selected by depressing knob 25 again to repeat the foregoing cycle. If it is desired to change the frequency corresponding to the selected abutment screw, this can be achieved by rotating knob 25 and changing the length l of the projecting portion of the selected abutment screw.

As is apparent from the foregoing description, depression of knob 25 is effective to rotate turret 45 in one direction only, through a predetermined angle, so that the turret rotates step-wise each time knob 25 is depressed. To select a particular screw 47, it may be necessary to depress knob 25 successively a number of times. Rotation of the turret to a particular position may be achieved rapidly by turning knob 23, which is capable of turning the turret in either direction. The mechanism associated with the turning of knob 23 will now be explained in detail.

By turning knob 23, cam 28 (FIGS. 1 and 3) secured to the first operating shaft 24 is rotated. Cam follower 32' of the movable piece 32, which initially engages a depressed portion of cam 28, is now caused to move onto a raised portion of the cam, whereby the operating rod 26 is depressed, against the force of spring 42, to bring gear wheel 39 out of mesh with the gear wheel 46 with which it is engaged. At the same time, spindle 58 comes out of a notch 57, as indicated in broken lines in FIG. 5.

After the disengagement between the gear wheels 39 and 46 has been effected, i.e., after the cam 28 has been rotated through an angle α as shown in FIG. 2, the rotation of the cam is transmitted to gear wheel 30 through projection 28' of the cam and slot 29 of gear wheel 30. Since gear wheel 30 is in mesh with gear wheel 54 formed integrally with turret 45, the turret is rotated. When the turret begins to rotate, the abutment screw 47 in contact with bar 87" breaks this contact, and slide member 85 slides toward the turret under the force of spring 85'. When the turret is rotated further, a raised portion of circumferential groove 64 on the periphery of the turret (FIG. 5) moves past spindle 58. This causes the spindle to be pushed into space 61 of movable piece 32, against the force of spring 62, so that the flange 58' of the spindle becomes arrested by claw lever 66, as shown in FIG. 7.

When knob 23 is rotated by one pitch (60° in the illustrated embodiment), cam follower 32' again engages a depressed portion of cam 28. However, since the turret at this moment has only rotated through 60° minus the angle α, spindle 58 of movable piece 32 does not come into a notch 57 of circumferential groove 64 but remains abutting an edge of groove 64 (even when held withdrawn by claw lever 66). Therefore, operating rod 26 does not completely return to its initial position, so gear wheel 39 remains disengaged from the adjacent gear wheel 46 of the turret. The final rotation of the turret through the remaining angle α is effected by cooperative action between the oscillating lever 52 and cam 53 (FIG. 2) against which the lever is biased by spring 51. The turret thus completes rotation by one pitch.

When, during the foregoing process, the selected abutment screw 47 strikes the flank of bar 87', displacement member 87 is rotated (clockwise or counterclockwise) about the hollow pivot shaft 86 in opposition to the force of the follower member 89. The action is the same for both directions of rotation of knob 23 and the turret. If knob 23 is turned successively through a plurality of pitches, rotation of the turret 45 as effected by the cooperative action of oscillating lever 52 and cam 53 may not occur until after the last pitch of rotation by knob 23 has been completed. The displacement member 87 is displaced every time an abutment screw 47 strikes it.

To achieve the desired selected frequency, it is necessary to position the slide member 85 so that bar 87' is in resilient contact with the free end of an abutment screw 47 selected by rotation of the turret. Rotational position of the turret can be indicated on a channel indicator (not shown) interlocked with the turret, but final tuning is achieved by depressing knob 25 to move slide member 85 away from the turret and then by releasing the knob to permit end-wise engagement of bar 87" with the selected abutment screw 47.

It will be recalled that spindle 58 of movable piece 32 on operating rod 26 remains arrested by claw lever 66, and when knob 25 is depressed, the spindle does not engage a step 59 of the cam grooves 56. Instead of entering an inclined portion 56", the spindle moves along an axial portion 56', so that depression of knob 25 does not impart a rotational force to the turret. When slide member 85 is pushed back beyond the free end of the longest abutment screw 47, there can be no abutment screw still contacting the flank of bar 87", so that the displacement member 87 will return under the resilient bias of follower member 89. At the final portion of the depression stroke of operating rod 26, claw lever 66 abuts arm d projecting from side plate D2 of frame A and is pivoted against the force of spring 67, releasing spindle 58. Further depression of operating rod 26 is stopped. When knob 25 is released, operating rod 26 returns, under the action of resetting spring 42, to the position shown in FIGS. 1 and 3, and movable piece 32 and gear wheel 39 also occupy their initial positions. Slide member 85 is thus brought into resilient contact with the end of a selected abutment screw 47 via bar 87" of displacement member 87, setting the final position of the slide member and thereby tuning the inductance 80 for selection of the desired frequency.

In summary, the length of the projecting portion of an abutment screw 47 is varied by rotating knob 25, so that the frequency memorized by the abutment screw can be adjusted. Step-wise rotation of turret 45 in one direction only is achieved by depressing knob 25. Turret 45 can be rotated through desired angles in either direction by turning knob 23, so as to select a particular abutment screw 47. Then depression of knob 25 effects tuning to the frequency corresponding to the selected abutment screw.

While a preferred embodiment of the invention has been shown and described, it will be apparent to those skilled in the art that changes can be made in this embodiment without departing from the principles and spirit of the invention, the scope of which is defined in the appended claims.

I claim:

1. Apparatus for selecting the position of a slide member, comprising a turret supported for rotation about an axis and having a plurality of circumferentially spaced position setting elements which project from an end of the turret toward the slide member, the slide member being supported for sliding movement toward and away from the position setting elements and being biased toward the position setting elements, the slide member having contact means adapted to engage a projecting end portion of a selected position setting element when that element is placed at a predetermined location by rotation of the turret, operating means for rotating the turret and concurrently moving the side member away from the position setting elements, and displacement means for movably supporting the contact means on the slide member to permit the contact means to move out of the way when struck by a position setting element as the turret is rotated and later to move into engagement with the end portion of the selected position setting element.

2. Apparatus in accordance with claim 1, wherein the slide member is coupled to and adjusts a variable reactance.

3. Apparatus in accordance with claim 2, wherein the reactance comprises a variable inductance.

4. Apparatus in accordance with claim 1, further comprising means for adjusting the projection of the selected position setting element.

5. Apparatus in accordance with claim 1, wherein the operating means comprises a rod supported for axial movement parallel to the axis of rotation of the turret and having means for engaging the slide member and moving the slide member away from the position setting elements when the rod is moved in a first axial direction and for permitting the slide member to move toward the position setting elements when the rod is moved in the opposite direction, and means responsive to movement of the rod in the first direction for rotating the turret.

6. Apparatus in accordance with claim 5, wherein the last-mentioned means comprises a cam secured to the turret and a spindle engageable with the cam and movable with the rod along the axis of the rod.

7. Apparatus in accordance with claim 6, wherein the cam comprises a zig-zag groove about the circumference of the turret and the spindle is spring-biased into the groove, and wherein the groove is stepped so that the spindle moves along a portion of the groove that is inclined relative to the axis of rotation of the turret and then returns along a portion of the groove that is parallel to the axis of rotation of the turret.

8. Apparatus in accordance with claim 5, wherein the rod is supported for rotation about its axis, and means responsive to the rotation of the rod for adjusting the projection of the selected position setting element.

9. Apparatus in accordance with claim 8, further comprising means for disabling said adjusting means in response to initial axial movement of the rod in said first direction.

10. Apparatus in accordance with claim 9, further comprising additional operating means for rotating the turret in opposite directions.

11. Apparatus in accordance with claim 10, wherein the additional operating means comprises a rotatable shaft.

12. Apparatus in accordance with claim 11, further comprising means responsive to initial turning of the shaft, before the turret has turned, for moving the rod in said first direction to disable the adjusting means.

13. Apparatus in accordance with claim 12, further comprising means including a cam secured to the turret and an oscillating spring-biased arm engaging the cam for turning the turret to its final position after the turret has been turned by the rotatable shaft.

14. Apparatus in accordance with claim 10, further comprising means responsive to operation of the additional operating means for rendering the first-mentioned operating means incapable of rotating the turret, whereby the first-mentioned operating means may move the slide member away from the position setting elements, without rotating the turret, after the turret has been turned by the additional operating means, and means responsive to the movement of the first-mentioned operating means for rendering the first-mentioned operating means capable of rotating the turret.

15. Apparatus for selecting the position of a slide member, comprising a turret supported for rotation about an axis and having a plurality of circumferentially spaced position setting elements which project from an end of the turret toward the slide member, the slide member being supported for sliding movement toward and away from the position setting elements and being biased toward the position setting elements, the slide member having contact means adapted to engage a projecting end portion of a selected position setting element when that element is placed at a predetermined location by rotation of the turret, operating means for rotating the turret, displacement means for movably supporting the contact means on the slide member to permit the contact means to move out of the way when struck by a position setting element as the turret is rotated and later to move into engagement with the end portion of the selected position setting element, and means for moving the slide member away from the position setting elements sufficiently to permit the contact means to clear the position setting element with the greatest projection from the turret, so that the contact means may engage the end portion of the selected position setting element when the slide member moves toward the position setting elements.

16. A frequency selector of the turret type, comprising:
(a) a rotatable turret having a plurality of individually adjustable position setting elements;
(b) a slide member coupled to a variable tuning element and adapted for resilient engagement with a selected position setting element;
(c) a slidable operating member which is depressed to impart successive step-wise rotation to the turret so as to select the position setting element with which the slide member is to be brought into engagement; and
(d) a displacement member on the slide member resiliently urged to maintain a normal position but movable from its normal position when struck by a position setting element as the turret is rotated, the slide member being brought into engagement with the selected position setting element via the displacement member.

17. A frequency selector in accordance with claim 16, wherein the operating member comprises means rotatable for adjusting the projection of the position setting element engaged by the slide member.

18. A frequency selector in accordance with claim 16, wherein the step-wise rotation of the turret is produced by means for converting linear motion of the operating member into rotary motion of the turret.

19. A frequency selector in accordance with claim 18, wherein the motion converting means comprises a cam member having a zig-zag shape with steps at points where the cam member changes direction, and a spindle coupled to the operating member in such a manner that it can be projected from or retracted into the operating member and which cooperates with the cam member for imparting a rotational force to the cam member.

20. A frequency selector as set forth in claim 19, wherein the cam member is integral with the turret.

21. A frequency selector as set forth in claim 20, wherein the cam member is formed on the outer periphery of the turret.

22. A frequency selector as set forth in claim 16, further comprising a second operating member which turns to cause the turret to rotate in either direction, the slide member being brought into engagement with the selected position setting element by depressing the first operating member after the turret has been rotated to a desired position by the second operating member.

* * * * *